(12) United States Patent
Yim et al.

(10) Patent No.: US 8,803,144 B2
(45) Date of Patent: Aug. 12, 2014

(54) THIN FILM TRANSISTOR SUSBTRATE INCLUDING OXIDE SEMICONDUCTOR

(75) Inventors: Hoon Yim, Daejeon (KR); Daehwan Kim, Paju-si (KR); Byungkook Choi, Goyang-si (KR); Sul Lee, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 113 days.

(21) Appl. No.: 13/333,720

(22) Filed: Dec. 21, 2011

(65) Prior Publication Data

US 2012/0168746 A1    Jul. 5, 2012

(30) Foreign Application Priority Data

Dec. 29, 2010    (KR) .......... 10-2010-0138284

(51) Int. Cl.
| H01L 29/786 | (2006.01) |
| H01L 27/12 | (2006.01) |
| H01L 21/16 | (2006.01) |

(52) U.S. Cl.
CPC .......... *H01L 29/786* (2013.01); *H01L 27/1225* (2013.01); *H01L 21/16* (2013.01)
USPC ............... 257/43; 257/72; 257/79; 257/88; 257/E29.273; 438/85; 438/86

(58) Field of Classification Search
CPC ..... H01L 29/7869; H01L 21/16; H01L 21/00; H01L 29/24; H01L 21/479; H01L 27/1225; H01L 29/786; G02F 1/13439
USPC ......... 257/43, 72, 79, 88; 438/85, 86, 104, 22
See application file for complete search history.

(56) References Cited

U.S. PATENT DOCUMENTS

| 6,501,014 | B1* | 12/2002 | Kubota et al. ............. 136/256 |
| 7,187,006 | B2* | 3/2007 | Hayashi ...................... 257/72 |
| 2004/0023432 | A1* | 2/2004 | Haga ......................... 438/104 |
| 2010/0244073 | A1* | 9/2010 | Ito et al. ..................... 257/98 |

FOREIGN PATENT DOCUMENTS

| CN | 101789443 A | 7/2010 |
| JP | 2007128117 A | 5/2007 |

OTHER PUBLICATIONS

Office Action issued in corresponding Chinese Patent Application No. 201110461343.4, mailed Feb. 8, 2014, 10 pages.

* cited by examiner

*Primary Examiner* — Thinh T Nguyen
(74) *Attorney, Agent, or Firm* — Brinks Gilson & Lione

(57) ABSTRACT

The present disclosure relates to a thin film transistor substrate for flat panel display device including oxide semiconductor. The present disclosure suggests a thin film transistor substrate for flat panel display device comprising: a transparent substrate; a thin film transistor layer having an oxide semiconductor material disposed on the transparent substrate; a passivation layer disposed on the whole surface of the thin film transistor layer; a pixel electrode formed on the passivation layer and contact the thin film transistor layer through a contact hole formed at the passivation layer; and a first ultra violet light absorbing layer disposed on the whole surface of the pixel electrode. Absorbing all of ultra violet light and passing all of the visible light, the photo-thermal characteristic is enhanced and the transparency property is not degraded.

9 Claims, 2 Drawing Sheets

THIN FILM TRANSISTOR SUSBTRATE INCLUDING OXIDE SEMICONDUCTOR

This application claims the priority and the benefit under 35 U.S.C. §119(a) on Patent Application No. 10-2010-0138284 filed in Republic of Korea on Dec. 29, 2010, the entire contents of which are hereby incorporated by reference.

BACKGROUND

1. Field of the Invention

The present disclosure relates to a thin film transistor substrate for flat panel display device including oxide semiconductor. Specifically, the present disclosure relates to a thin film transistor substrate having the n-type oxide semiconductor material and the stability for the ultra violet light is enhanced.

2. Discussion of the Related Art

Nowadays, as the data process devices such as personal computer, PDA (Personal Digital Assistant), SMART phone, cellular or mobile phone and so on are developed, the requirement for the light weight, thin and small display device is increasing and the various flat panel display devices are developed for satisfying these market trends. The flat panel display devices include the liquid crystal display device (or 'LCD'), the field emission display (or 'FED'), the plasma display panel (or 'PDP'), the electro luminescence device (or 'ELD') and so on. For the mass production technology, driving easiness, high definition video quality and low power consumption, the LCD or OLED (organic light emitting diode display device) in which the thin film transistors are arrayed in matrix type is mostly used.

An active matrix type liquid crystal display device (or "AMLCD") represents video data using the thin film transistor (or "TFT") as the switching element. The active matrix type thin film transistor substrate drives the pixels of the display device using the amorphous silicon thin film transistor (or "a-Si TFT"). As the a-Si TFT is manufactured with the low cost and under the low temperature processing, it is mainly used for manufacturing the thin film transistor substrate of the flat panel display device.

However, as the a-Si TFT has the low mobility property and bad static electric characteristics, when it is applied to the large area display device, it is hard to ensure good display quality. In order to overcome this problem, the poly silicon thin film transistor (or "p-Si TFT") is suggested to use for the large area display device. However, there are some other problems. For example, the cost for manufacturing the poly silicon TFT substrate is very high. The manufacturing processes are conducted in high temperature. Furthermore, for the large area display device, it is hard to get the uniform characteristics of the poly silicon TFTs. In that case, the static electric characteristics also degraded.

To overcome these problems, the oxide thin film transistor is suggested. The oxide thin film transistor is not only manufactured under the low temperature processings but also has better static electric characteristics than that of the a-Si TFT or p-Si TFT. Therefore, it is possible to manufacture the thin film transistor substrate having uniform characteristics over the large display area with low cost.

For the oxide semiconductor materials, there is the amorphous indium gallium zinc oxide (a-InGaZnO4: a-IGZO). As the a-IGZO TFT has superior characteristics when using the conventional manufacturing facilities for the a-Si TFT, additional cost is not required to develop the facilities for manufacturing the a-IGZO TFT. For example, the sputter facility can be used to deposit the a-IGZO layer. As for the structure of the thin film transistor having this oxide semiconductor, the back channel etch type and the etch stopper type are considerable. Especially, for better characteristics, the etch stopper type is the best structure for oxide TFT.

When using the a-IGZO semiconductor material, there is no special problem at estimation for the bias temperature stress (BTS) characteristics or photo characteristics, respectively. However, when satisfying the both characteristics simultaneously, the stability of the oxide TFT is seriously degraded. This is the important obstacle when the oxide semiconductor is applied to the display device in which the transparent property is mostly considered.

BRIEF SUMMARY

A thin film transistor substrate for flat panel display device comprises: a transparent substrate; a thin film transistor layer having an oxide semiconductor material disposed on the transparent substrate; a passivation layer disposed on the whole surface of the thin film transistor layer; a pixel electrode formed on the passivation layer and contact the thin film transistor layer through a contact hole formed at the passivation layer; and a first ultra violet light absorbing layer disposed on the whole surface of the pixel electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Figure 1:
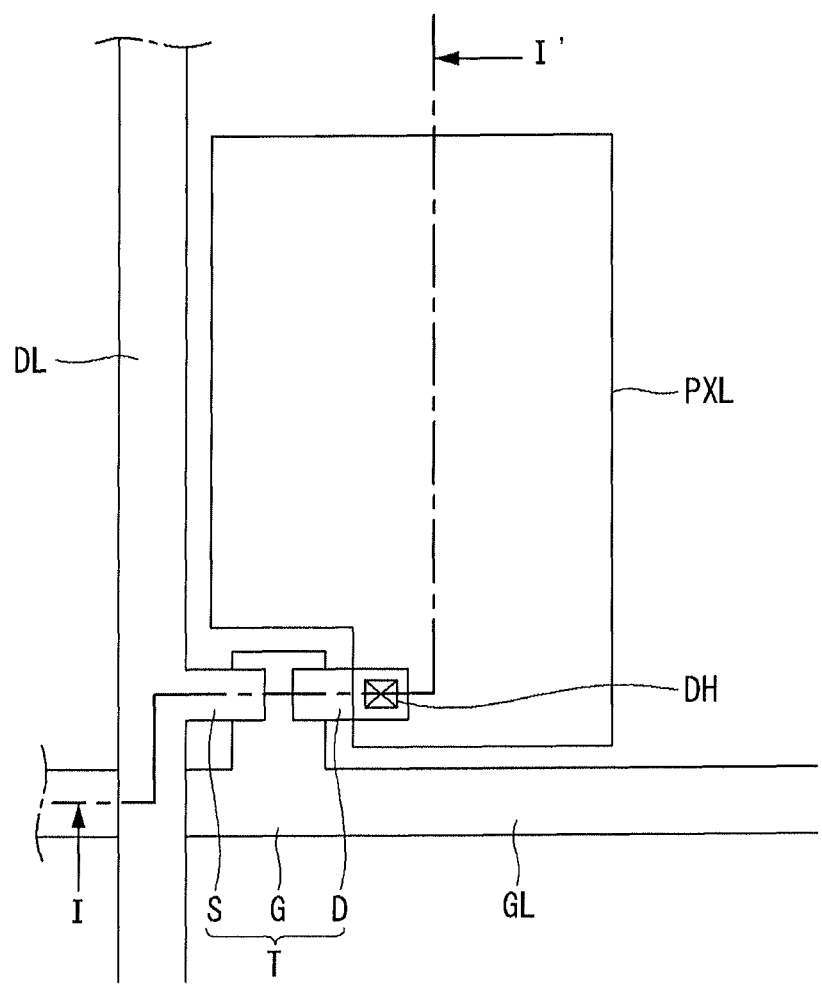
FIG. 1 is the plane view illustrating the structure of the thin film transistor substrate including the oxide semiconductor according to an embodiment of the present disclosure.

Hereinafter, referring to attached FIGS. 1 to 3, we will explain preferred embodiments of the present disclosure. FIG. 1 is the plane view illustrating the structure of the thin film transistor substrate including the oxide semiconductor according to the present disclosure.

The thin film transistor substrate for flat panel display device according to the present disclosure is used for the liquid crystal display device or the organic light emitting diode display device. The flat panel display may further include the color filter substrate facing with the thin film transistor substrate. As the present disclosure is related to the thin film transistor substrate, hereinafter, we will explain about the substrate having a plurality of the thin film transistor disposed in a matrix pattern for driving the pixels.

Figure 2:
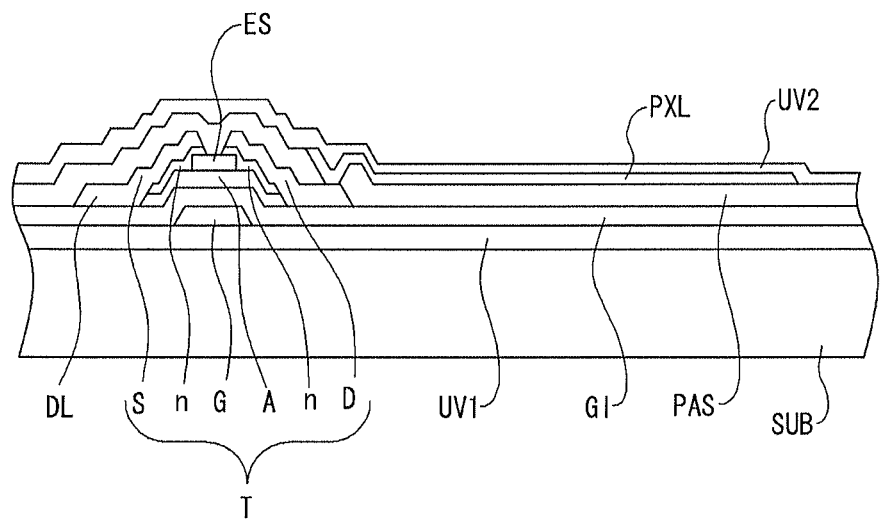
FIG. 2 is the cross-sectional view illustrating the structure of the thin film transistor substrate including the oxide semiconductor according to the first embodiment of the present disclosure.

FIG. 2 is the cross-sectional view illustrating the structure of the thin film transistor substrate including the oxide semiconductor according to the first embodiment of the present disclosure. FIG. 2 is the cross sectional view cutting along the line I-I' in FIG. 1. Referring to FIGS. 1 and 2, the thin film transistor substrate according to the first embodiment of the present disclosure comprises a plurality of gate line GL and a plurality of data line DL disposed with crossing each other on a transparent substrate SUB. Furthermore, it comprises a thin film transistor T and a pixel electrode PXL in the pixel area defined by the crossing structure of the gate line GL and the data line DL.

On whole surface of the transparent substrate SUB, a lower UV absorbing layer UV1 is deposited. The lower UV absorbing layer UV1 includes the material for absorbing the ultra violet light. Especially, the lower UV absorbing layer UV1 may pass all of the visible light while it absorbs the ultra violet light, in order to have the same transparency with the transparent substrate SUB to the visible light. To do so, the lower UV absorbing layer UV1 may be an oxide material such as indium (In), tin (Sn), gallium (Ga) or zinc (Zn). For example, the lower UV absorbing layer UV1 comprises at least one of indium oxide, tin oxide, gallium oxide and zinc oxide.

On the lower UV absorbing layer UV1, a plurality of gate line GL running in horizontal direction are disposed with a predetermined distance in vertical direction. A gate electrode G is branched from the gate line GL into the pixel area. Even though not shown in the figures, a gate pad may be formed at one end of the gate line GL.

On the transparent substrate SUB having the gate electrode G, a gate insulating layer GI is deposited. On the gate insulating layer GI, a channel layer A having a semiconductor material is formed to overlap with the gate electrode G. The channel layer A may comprise an oxide semiconductor material. For example, the channel layer A may includes an amorphous indium gallium zinc oxide (a-IGZO).

On the transparent substrate SUB having the channel layer A, a plurality of data line DL is formed to cross with the gate line GL. At one side of the channel layer A, a source electrode S branched from the data line DL is contacted. At the other side of the channel layer A, a drain electrode D facing the source electrode with a predetermined distance is contacted. Between the source electrode S and the channel layer A, and between the drain electrode D and the channel layer A, there is an ohmic contact layer n is disposed. The ohmic contact layer n should not be formed on the portion of the channel layer A between the source electrode S and the drain electrode D. To do so, after disposing the ohmic contact layer n, this portion is removed by an etching process. In the etching process, the channel layer A should not be damaged by the etchant. To protect the channel layer A, at the middle portion of the channel layer A between the source electrode S and the drain electrode D, an etch stopper ES may be further included. Finally, a thin film transistor T including the source electrode S, the drain electrode D, the channel layer A and the gate electrode G is completed.

On the transparent substrate SUB having the source electrode S and the drain electrode D, a passivation layer PAS is disposed covering the whole surface. By patterning the passivation layer PAS, a drain contact hole DH exposing some portions of the drain electrode D is formed. On the passivation layer PAS, a pixel electrode PXL contacting the drain electrode D through the drain contact hole DH is formed.

On the transparent substrate SUB having the pixel electrode PXL and the thin film transistor T, an upper UV absorbing layer UV2 is disposed covering the whole surface. Like the lower UV absorbing layer UV1, the upper UV absorbing layer UV2 absorbs the ultra violet light while it passes all of visible light to have the same transparent property with that of the transparent substrate SUB. For example, the upper UV absorbing layer UV2 comprises at least one of indium oxide, tin oxide, gallium oxide and zinc oxide.

According to the first embodiment, the thin film transistor substrate for flat panel display device includes the lower UV absorbing layer UV1 and the upper UV absorbing layer UV2 under and over the thin film transistor T, respectively. As a result, all ultra violet light which may incident from outside into the thin film transistor T including the oxide semiconductor channel layer A can be protected. However, as all of the visible light can be passing through the lower UV absorbing layer UV1 and the upper UV absorbing layer UV2, this substrate can be working as the display panel.

Hereinafter, referring to FIGS. 1 and 3, we will explain about the second embodiment of the present disclosure. FIG. 3 is the cross-sectional view illustrating the structure of the thin film transistor substrate including the oxide semiconductor according to the second embodiment of the present disclosure. FIG. 3 is the cross sectional view cutting along the line I-I' in FIG. 1.

Figure 3:
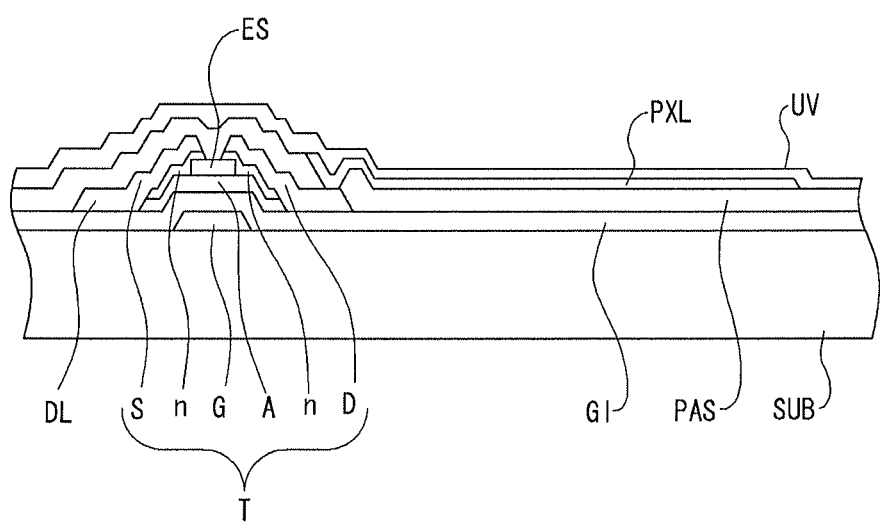
FIG. 3 is the cross-sectional view illustrating the structure of the thin film transistor substrate including the oxide semiconductor according to the second embodiment of the present disclosure.

Referring to FIGS. 1 and 3, the thin film transistor substrate according to the second embodiment of the present disclosure comprises a plurality of gate line GL and a plurality of data line DL disposed with crossing each other on a transparent substrate SUB. Furthermore, it comprises a thin film transistor T and a pixel electrode PXL in the pixel area defined by the crossing structure of the gate line GL and the data line DL.

On the transparent substrate SUB, a plurality of gate line GL running in horizontal direction are disposed with a predetermined distance in vertical direction. A gate electrode G is branched from the gate line GL into the pixel area. Even though not shown in the figures, a gate pad may be formed at one end of the gate line GL.

On the transparent substrate SUB having the gate electrode G, a gate insulating layer GI is deposited. The gate insulating layer GI includes the material for absorbing the ultra violet light. Especially, the gate insulating layer GI may pass all of the visible light while it absorbs the ultra violet light, in order to have the same transparency with the transparent substrate SUB to the visible light. To do so, the gate insulating layer GI may be an oxide material such as indium (In), tin (Sn), gallium (Ga) or zinc (Zn). For example, the gate insulating layer GI comprises at least one of indium oxide, tin oxide, gallium oxide and zinc oxide.

On the gate insulating layer GI, a channel layer A having a semiconductor material is formed to overlap with the gate electrode G. The channel layer A may comprise an oxide semiconductor material. For example, the channel layer A may includes an amorphous indium gallium zinc oxide (a-IGZO).

On the transparent substrate SUB having the channel layer A, a plurality of data line DL is formed to cross with the gate line GL. At one side of the channel layer A, a source electrode S branched from the data line DL is contacted. At the other side of the channel layer A, a drain electrode D facing the source electrode with a predetermined distance is contacted. Between the source electrode S and the channel layer A, and between the drain electrode D and the channel layer A, there is an ohmic contact layer n is disposed. The ohmic contact layer n should not be formed on the portion of the channel layer A between the source electrode S and the drain electrode D. To do so, after disposing the ohmic contact layer n, this portion is removed by an etching process. In the etching process, the channel layer A should not be damaged by the etchant. To protect the channel layer A, at the middle portion of the channel layer A between the source electrode S and the drain electrode D, an etch stopper ES may be further included.

Finally, a thin film transistor T including the source electrode S, the drain electrode D, the channel layer A and the gate electrode G is completed.

On the transparent substrate SUB having the source electrode S and the drain electrode D, a passivation layer PAS is disposed covering the whole surface. By patterning the passivation layer PAS, a drain contact hole DH exposing some portions of the drain electrode D is formed. On the passivation layer PAS, a pixel electrode PXL contacting the drain electrode D through the drain contact hole DH is formed.

On the transparent substrate SUB having the pixel electrode PXL and the thin film transistor T, a UV absorbing layer UV is disposed covering the whole surface. The UV absorbing layer UV absorbs the ultra violet light while it passes all of visible light to have the same transparent property with that of the transparent substrate SUB. For example, the UV absorbing layer UV comprises at least one of indium oxide, tin oxide, gallium oxide and zinc oxide.

According to the second embodiment of the present disclosure, the thin film transistor substrate for flat panel display device includes the gate insulating layer of the thin film transistor T having the ultra violet light absorbing material and the UV absorbing layer UV over the thin film transistor T. As a result, all ultra violet light which may incident from outside into the thin film transistor T including the oxide semiconductor channel layer A can be protected. However, as all of the visible light can be passing through the gate insulating layer having the UV absorbing material and the UV absorbing layer UV, this substrate can be working as the display panel.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

The invention claimed is:

1. A thin film transistor substrate for flat panel display device comprising:
   a transparent substrate;
   a thin film transistor layer including a channel layer having an oxide semiconductor material disposed on the transparent substrate;
   a passivation layer disposed on the whole surface of the thin film transistor layer;
   a pixel electrode on the passivation layer and contacting the thin film transistor layer through a contact hole formed at the passivation layer;
   a first ultra violet light absorbing layer disposed on the whole surface of the pixel electrode; and
   a second ultra violet light absorbing layer disposed between the transparent substrate and the thin film transistor layer.

2. The device according to the claim 1, wherein the first ultra violet light absorbing layer includes a material absorbing all of ultra violet light and passing all of visible light.

3. The device according to the claim 1, wherein the first ultra violet light absorbing layer includes at least one of an indium oxide, a tin oxide, a gallium oxide and a zinc oxide.

4. The device according to the claim 1, wherein the first ultra violet light absorbing layer and the second ultra violet light absorbing layer include a material absorbing all of ultra violet light and passing all of visible light.

5. The device according to the claim 1, wherein the first ultra violet light absorbing layer and the second ultra violet light absorbing layer include at least one of an indium oxide, a tin oxide, a gallium oxide and a zinc oxide.

6. The device according to the claim 1, wherein the oxide semiconductor material includes an indium-gallium-zinc oxide material.

7. The device according to the claim 1, wherein the thin film transistor layer comprises:
   a gate line running to horizontal direction on the transparent substrate;
   a gate electrode branching from the gate line;
   a gate insulating layer covering the gate line and the gate electrode;
   the channel layer overlapping with the gate electrode on the gate insulating layer and including the oxide semiconductor material;
   a data line running to vertical direction on the transparent substrate;
   a source electrode branching from the data line and contacting one side of the channel layer; and
   a drain electrode facing with the source electrode and contacting other side of the channel layer.

8. The device according to the claim 1, wherein the gate insulating layer includes a material absorbing all of ultra violet light and passing all of visible light.

9. The device according to the claim 8, wherein the gate insulating layer includes at least one of an indium oxide, a tin oxide, a gallium oxide and a zinc oxide.

* * * * *